(12) United States Patent
Kim

(10) Patent No.: US 6,661,046 B2
(45) Date of Patent: Dec. 9, 2003

(54) IMAGE SENSOR AND METHOD FOR FABRICATING THE SAME

(75) Inventor: Chae-Sung Kim, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/941,481

(22) Filed: Aug. 29, 2001

(65) Prior Publication Data

US 2002/0079504 A1 Jun. 27, 2002

(30) Foreign Application Priority Data

Aug. 31, 2000 (KR) ........................................ 2000-51354

(51) Int. Cl.[7] ........................ H01L 29/06; H01L 31/062; H01L 31/113
(52) U.S. Cl. ........................ 257/292; 257/293; 257/10; 257/233
(58) Field of Search ................................ 257/292, 293, 257/233, 10

(56) References Cited

U.S. PATENT DOCUMENTS

| | | | | |
|---|---|---|---|---|
| 5,371,397 A | * | 12/1994 | Maegawa et al. | 257/432 |
| 6,002,145 A | * | 12/1999 | Niisoe | 257/222 |
| 6,031,512 A | * | 2/2000 | Kadota et al. | 345/88 |
| 6,194,244 B1 | * | 2/2001 | Yamaguchi et al. | 438/57 |

FOREIGN PATENT DOCUMENTS

KR          2001061056 A     *  7/2001

* cited by examiner

Primary Examiner—Jerome Jackson
Assistant Examiner—Joseph Nguyen
(74) Attorney, Agent, or Firm—Marshall, Gerstein & Borun LLP

(57) ABSTRACT

A CMOS image sensor for improving a characteristic of transmittance therein is provided by forming a convex-shaped color filter pattern that acts as a micro-lens. The CMOS image sensor includes a semiconductor structure having a photodiode and a peripheral circuit, an insulating layer that is formed on the semiconductor structure and that has a trench, and a convex-shaped color filter pattern formed on the insulating layer and covering the trench.

5 Claims, 4 Drawing Sheets

IMAGE SENSOR AND METHOD FOR FABRICATING THE SAME

FIELD OF THE INVENTION

The present invention relates to an image sensor, and, more particularly, to an image sensor having a convex-shape color filter pattern that acts as a micro-lens, thereby achieving improved optical transmittance.

BACKGROUND OF THE INVENTION

As is well known, an image sensor is an apparatus for sensing a light beam reflected from an object to generate image data. An image sensor fabricated by using complementary metal oxide semiconductor (CMOS) technology, for example, is called a CMOS image sensor.

Generally, the CMOS image sensor includes a plurality of unit pixels, including a light sensing element and a plurality of transistors. The light sensing element, such as a photodiode, senses the incident light beam and generates photoelectric charges corresponding to the amount of the incident light beam sensed. The transistors perform switching operations to control transfer of the photoelectric charges.

FIG. 1 is a circuit diagram showing a conventional unit pixel 10 contained in a CMOS image sensor. Here, a reference symbol ML represents a load transistor for controlling a current that flows via an output node NO of the unit pixel 10. The unit pixel 10 includes a photodiode 12 and four transistors: a transfer transistor MT, a reset transistor MR, a drive transistor MD and a select transistor MS. Reference numerals TX, RX and SX denote control signals to turn on and off the transistors MT, MR and MS, respectively.

The photodiode 12 senses an incident light to generate photoelectric charges. The transfer transistor MT, coupled between the photodiode 12 and a sensing node NS, transfers the photoelectric charges to the sensing node NS. The reset transistor MR, coupled between a power terminal VDD and the sensing node NS, transfers a reset voltage level from the voltage source to the photodiode 12 and the drive transistor MD.

The drive transistor MD, whose drain is coupled to the power terminal VDD, amplifies a voltage level at the sensing node NS to output an amplified signal. The select transistor MS, coupled between the drive transistor MD and the output node NO, performs a switching operation to output the amplified signal as image data via the output node NO.

FIG. 2 is a cross-sectional view showing a conventional CMOS image sensor, where a field oxide layer 21, a transfer transistor 22 and a photodiode 23 are formed on a semiconductor substrate 20. An insulating layer 24 and a color filter 25 are sequentially formed on the entire semiconductor structure. Additionally, an over coating layer (OCL) 26 for planarization is formed on the color filter 25, and a micro-lens 27 is formed on the OCL 26.

In such conventional sensors, since the color filter 25, the OCL 26 and the micro-lens 27 are formed by using separate photoresist layers, an exposure step and a development step are carried out for each layer. It is, therefore, difficult to selectively replace a defective layer among the stacked photoresists. Additionally, the optical transmittance is low in such multilayer CMOS image sensors and residual products that affect sensor performance can occur during fabrication.

SUMMARY OF THE INVENTION

In accordance with an aspect of the present invention, a CMOS image sensor is provided which comprises: a semiconductor structure; an insulating layer formed on the semiconductor structure, wherein the insulating layer has a trench; and a convex-shaped color filter pattern formed on the insulating layer and covering the trench.

In accordance with an aspect of the present invention, a method is provided for fabricating a CMOS image sensor. The method comprises the steps of: a) providing a semiconductor structure; b) forming an insulating layer on the semiconductor structure; c) selectively etching the insulating layer to form a trench; d) coating a dyed photoresist on the insulating layer, wherein the dyed photoresist covers the trench; e) carrying out an exposure operation and a development operation on the dyed photoresist to thereby obtain a color filter pattern; and f) performing a thermal treatment, so that the color filter pattern develops a convex shape.

BRIEF DESCRIPTION OF THE DRAWINGS

The disclosed apparatus and method will now be described with reference to the accompanying drawings, in which.

DETAILED DESCRIPTION OF THE PREFERRED EMBODIMENTS

Figure 1:
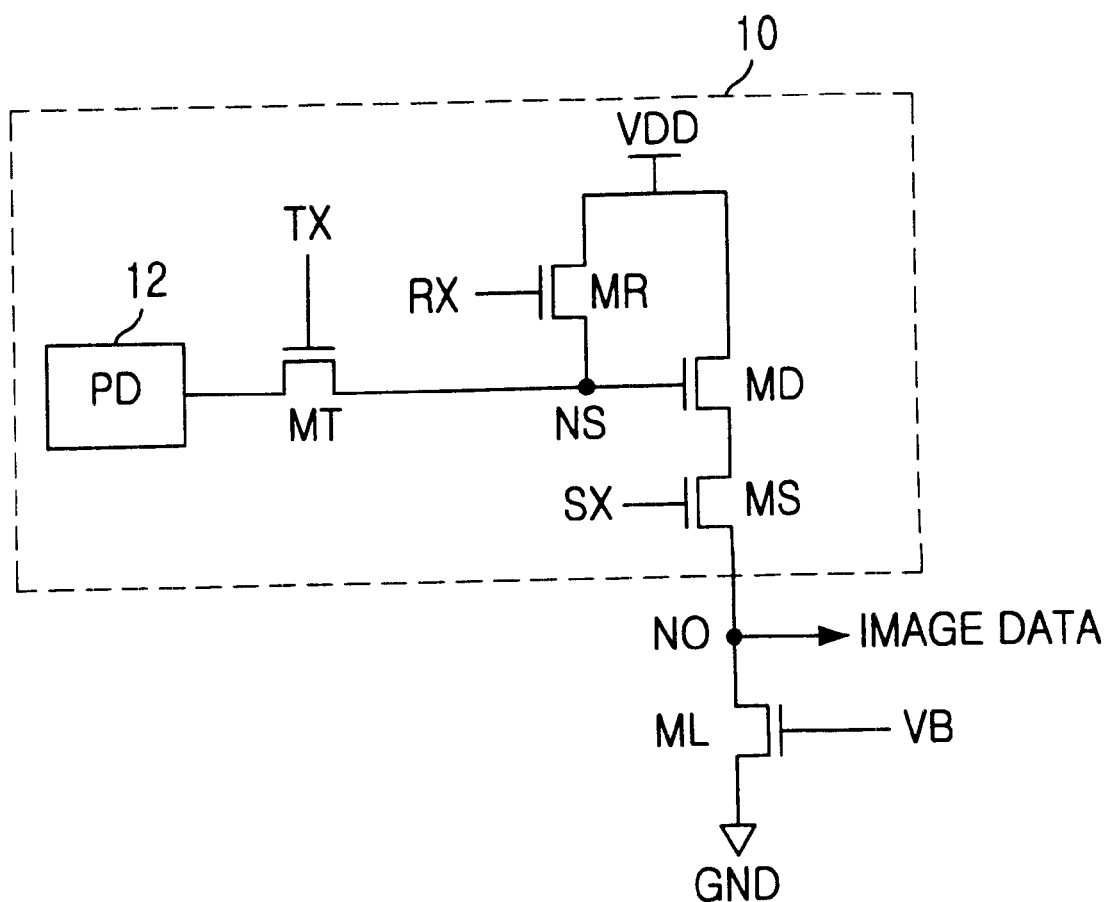
FIG. 1 is a schematic diagram showing a conventional unit pixel of a CMOS image sensor.
Figure 2:
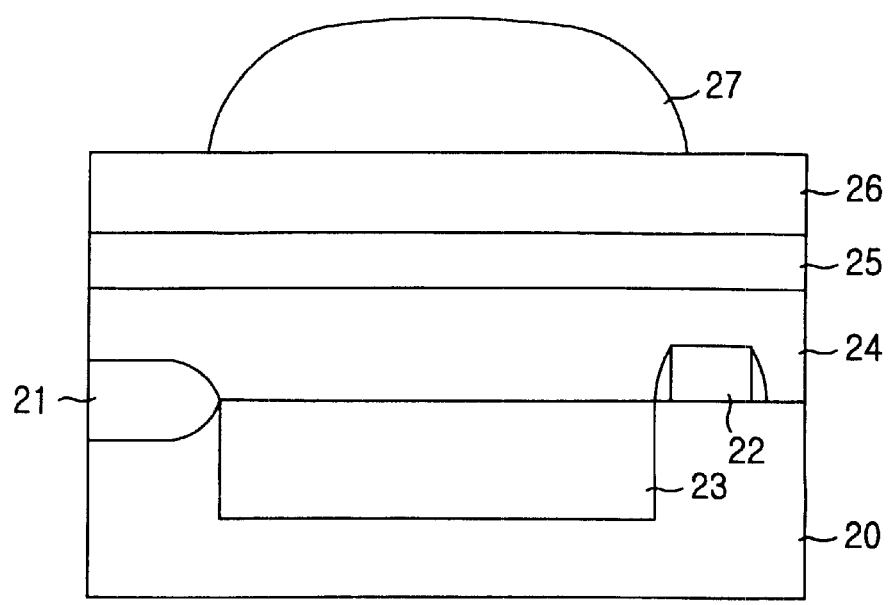
FIG. 2 is a cross-section view showing a conventional CMOS image sensor.
Figure 3:
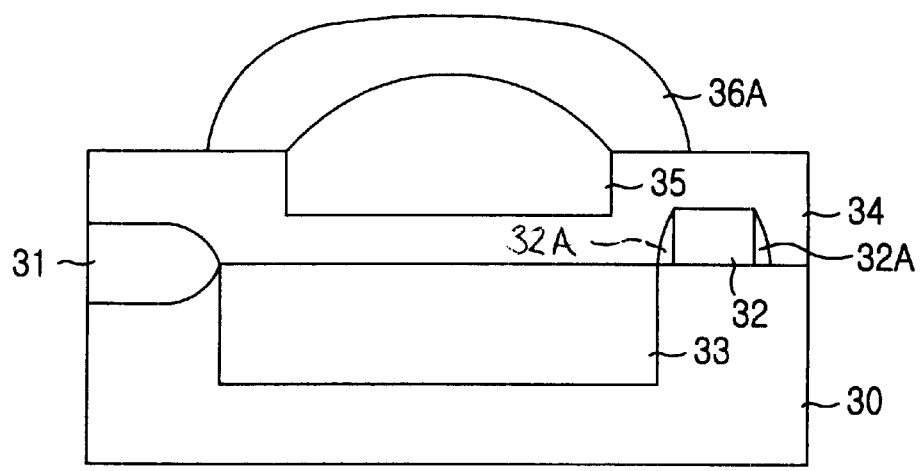
FIG. 3 is a cross-sectional view illustrating an exemplary CMOS image sensor constructed in accordance with teachings of the present invention.

FIG. 3 is a cross-sectional view illustrating an exemplary CMOS image sensor constructed in accordance with the teachings of the present invention. The illustrated CMOS image sensor includes a semiconductor substrate 30, an insulating layer 34 formed on the semiconductor structure and having a trench 35, and a convex-shaped color filter pattern 36A that is formed on the insulating layer 34 and covers the trench 35.

The semiconductor structure includes a light sensing element such as a photodiode 33 and a peripheral circuit, such as a transfer transistor 32. The convex-shaped color filter pattern 36A is obtained by coating a dyed photoresist and carrying out an exposure operation and a development operation. Also, a thermal treatment of the dyed photoresist is carried out to thereby obtain the convex-shaped color filter pattern.

Figure 4A:
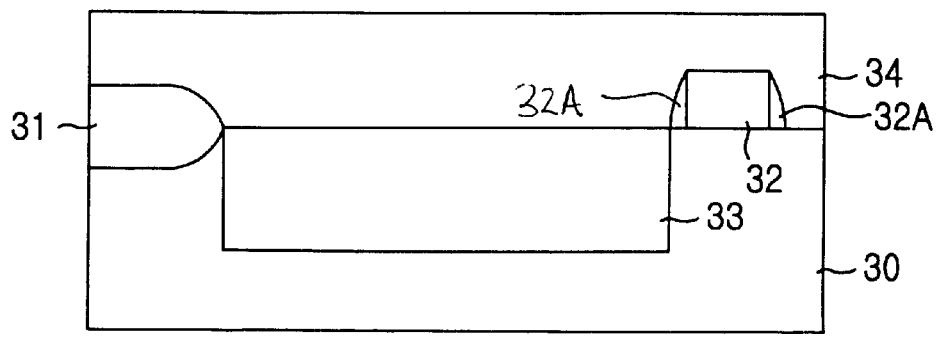
FIGS. 4A to 4D are cross-sectional views illustrating sequential steps of fabricating the CMOS image sensor shown in FIG. 3.

Hereinafter, a method for fabricating the CMOS image sensor shown in FIG. 3 will be described with reference to FIGS. 4A to 4D. In FIG. 4A, a field oxide layer 31, the transfer transistor 32 and the photodiode 33 are formed on the semiconductor substrate 30 to thereby provide the semiconductor structure. The transfer transistor 32 has oxide spacers 32A. Then, the insulating layer 34 is formed on the semiconductor structure.

Figure 4B:
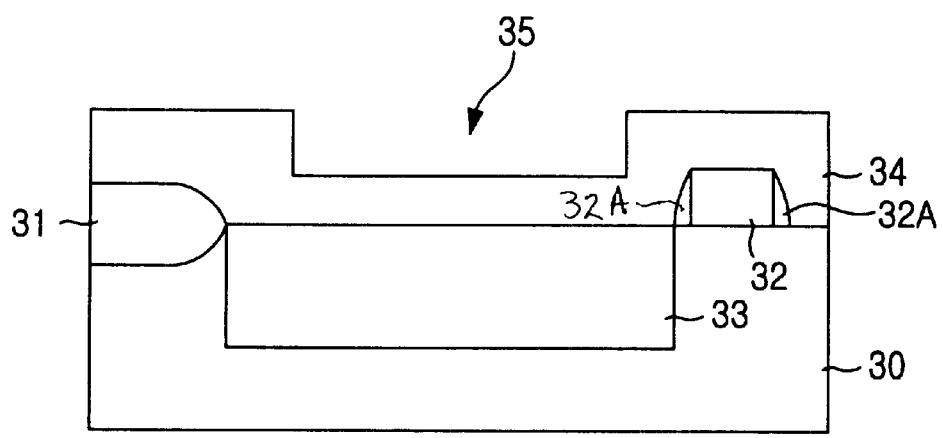
Figure 4C:
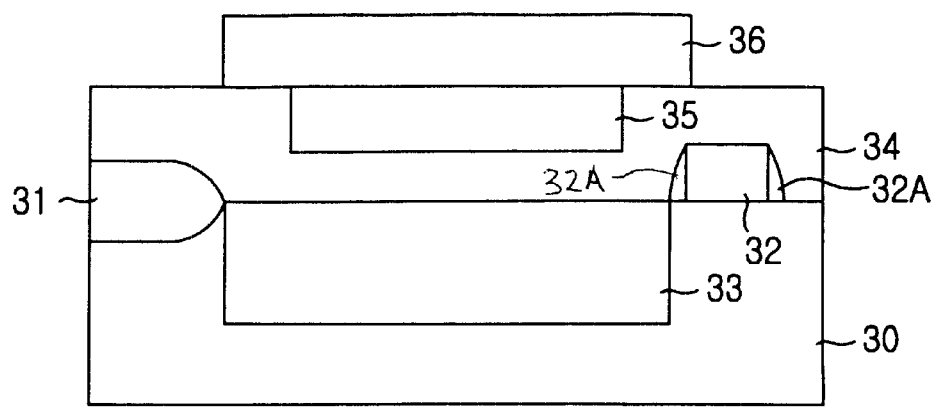

As shown in FIG. 4B, the insulating layer 34 is selectively etched to form the trench 35 whose bottom portion is formed above the photodiode 33. Referring to FIG. 4C, a dyed photoresist is coated on the insulating layer 34, and an exposure operation and a development operation is carried out to thereby form a first color filter pattern 36.

Figure 4D:
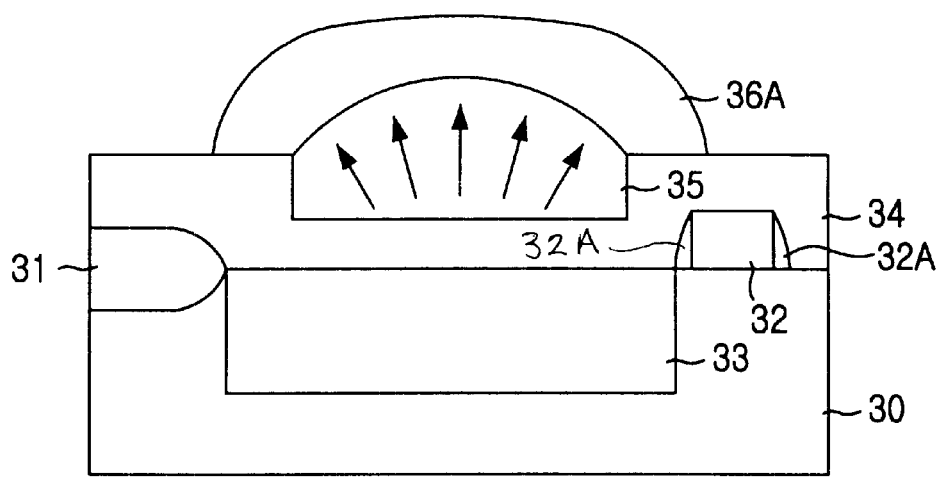

Referring to FIG. 4D, a thermal treatment is carried out. As a result, air filled within the trench 35 is moved outward, so that the color filter 36 covering an upper portion of the trench 35 obtains a convex shape. With this shape the formed convex-shaped color filter pattern 36A acts as a micro-lens.

As described above, since the color filter 36 and a micro-lens 36A are formed by a single photoresist pattern, there are fewer photoresist layers and the optical transmittance in the illustrated CMOS image sensor is improved. Furthermore, it is possible to selectively replace a defective portion of the sensor, and CMOS image sensor fabrication is simplified because the OCL planarized layer is omitted.

From the foregoing, persons of ordinary skill in the art will appreciate that the disclosed CMOS image sensor has a convex-shaped color filter pattern that acts as a micro-lens, capable of improving the optical transmittance of the sensor.

Although an exemplary apparatus and method have been disclosed for illustrative purposes, those skilled in the art will appreciate that the teachings of the invention are not limited to the disclosed apparatus and method. On the contrary, the teachings of the invention cover all apparatus and methods falling within the scope and spirit of the accompanying claims.

What is claimed is:

1. A CMOS image sensor comprising:
   a semiconductor structure including a light sensing element;
   an insulating layer formed on the semiconductor structure, wherein the insulating layer has a trench overlapped with the light sensing element, the trench having an opening; and
   a convex-shaped photoresist pattern formed on the insulating layer and covering the opening of the trench, so that the trench is filled with air, wherein the photoresist pattern acts as a color filter and a lens.

2. The CMOS image sensor as recited in claim 1, wherein the semiconductor structure includes a peripheral circuit.

3. The CMOS image sensor as recited in claim 1, wherein the light sensing element is a photodiode.

4. The CMOS image sensor as recited in claim 1, wherein the convex-shaped photoresist pattern is a dyed photoresist.

5. The CMOS image sensor as recited in claim 4, wherein a thermal treatment to the dyed photoresist is further carried out to thereby obtain the convex-shaped photoresist pattern.

* * * * *